United States Patent [19]

Buzzelli

[11] Patent Number: 4,853,829

[45] Date of Patent: Aug. 1, 1989

[54] ELECTRONIC MODULE LOCKING MECHANISM

[75] Inventor: Dennis K. Buzzelli, Old Bethpage, N.Y.

[73] Assignee: Eaton Corporation, Cleveland, Ohio

[21] Appl. No.: 269,082

[22] Filed: Nov. 9, 1988

[51] Int. Cl.⁴ .............................................. H05K 7/20
[52] U.S. Cl. .................................. 361/386; 361/391; 165/80.1; 165/185
[58] Field of Search ............... 361/390, 391, 392, 393, 361/394, 382, 383, 384, 385, 386; 174/16 HS; 165/80.1, 80.2, 80.3, 185

[56] References Cited

U.S. PATENT DOCUMENTS

| 2,583,586 | 1/1952 | Miller | 361/391 |
| 3,467,891 | 9/1969 | Mogle | 361/391 |
| 3,576,515 | 4/1971 | Frantz | 361/391 |
| 3,848,953 | 11/1974 | Petroshanoff | 361/391 |
| 4,701,829 | 10/1987 | Bricaud | 361/386 |
| 4,751,963 | 6/1988 | Bui et al. | 361/386 X |

Primary Examiner—Roy N. Envall, Jr.
Attorney, Agent, or Firm—A. E. Chrow

[57] ABSTRACT

A locking mechanism (100) for locking an electronic module (10) to a heat sink plate (12) is provided. Mechanism (100) features a slide block (16) slidably disposed in a slide track that is secured to plate (12). Block (16) is urged into heat transfer contacting engagement with module (10) by means of a shaft member (18) having a detent pin (34) that is biased by a resiient biasing member (44) outwardly into an opening (20) in the slide track wall (14) to positively lock block (16) against module (10) and requiring compression of member (44) through opening (20) from outside of the slide track wall to release block (16) from module (10).

10 Claims, 3 Drawing Sheets

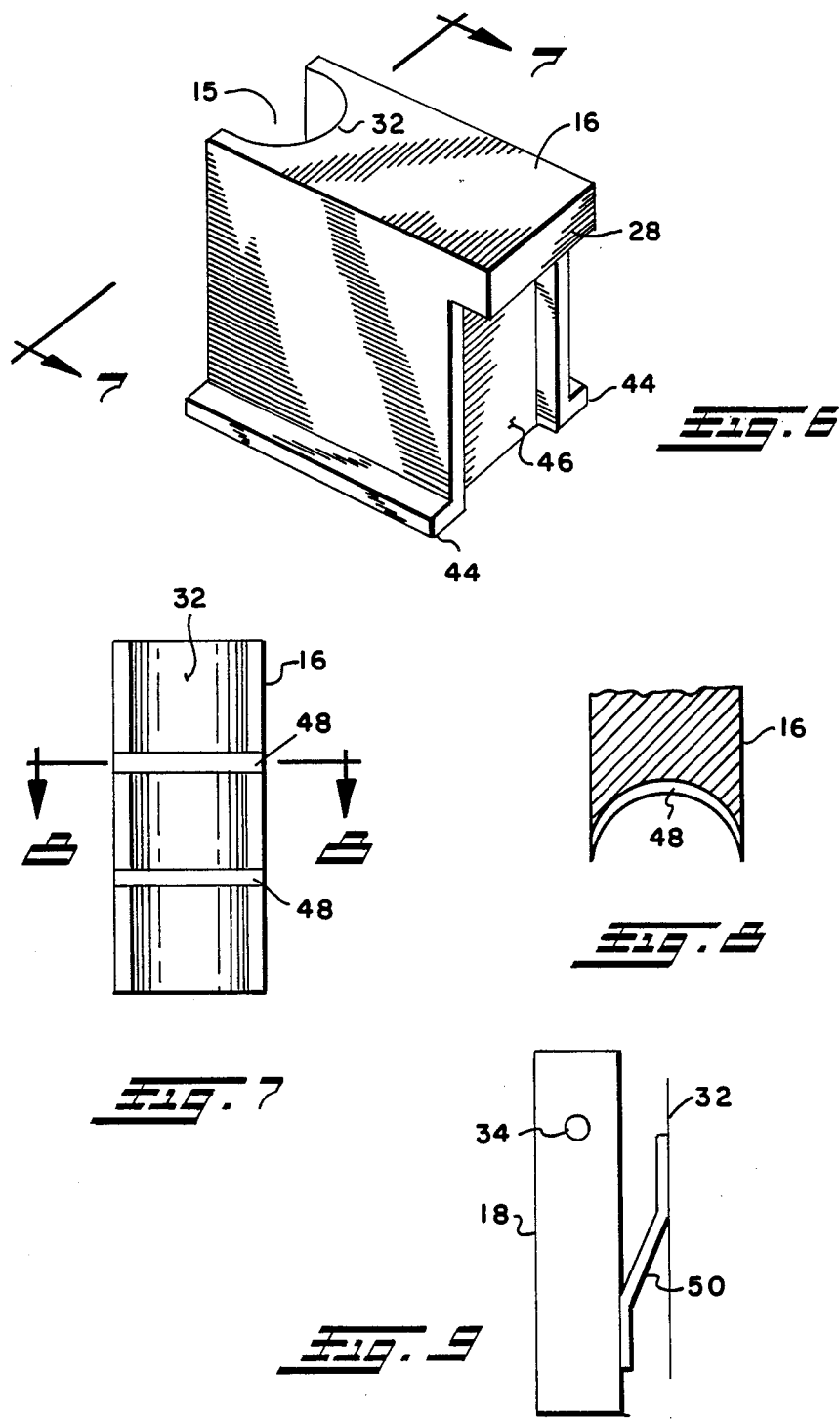

# ELECTRONIC MODULE LOCKING MECHANISM

INTRODUCTION

This invention relates generally to a mechanism for locking an electronic module in heat transfer contacting engagement with a chill plate (heat sink) and more particularly to such mechanism having a resiliently biased locking member operative to insure maintenance of the heat transfer contact engagement by requiring compression of the locking member through an aperture in the mechanism preferably in combination with the requirement of having to rotate a shaft member of the mechanism in order to effect release and disengagement between the module and chill plate.

BACKGROUND OF THE INVENTION

It is known to provide a heat sink for cooling electronic modules such as circuit board assemblies and radio frequency modules in electronic equipment to insure their satisfactory performance under varying environmental conditions.

The heat sink is characteristically a heat absorbing metal plate commonly called a chill plate to which at least one side and often both sides of the electronic module is held in heat transfer contact engagement by being clamped between substantially parallel spaced-apart plates of which at least one and preferably both are chill plates.

The prior art mechanisms heretofor employed for providing heat transfer contact between the chill plate and the electronic module have not been entirely satisfactory in that they are apt to loosen during handling or when subjected to vibration and thus have not insured a positive locked engagement insuring heat transfer engagement and often times even support of the module.

SUMMARY OF THE INVENTION

Accordingly, it is an object of this invention to provide a locking mechanism for providing a locked heat transfer contact engagement between an electronic module and a heat sink.

It is another object of this invention to provide a locking mechanism for locking an electronic module in heat transfer engagement with a heat sink that is resistant to loosening and disengagement during handling and under vibratory conditions.

It is still another object of this invention to provide a positive locking mechanism for locking an electronic module in heat transfer contact engagement with a heat sink that requires compression of a resiliently biased locking member through an aperture in order to effect disengagement.

It is yet another object to provide a positive locking mechanism on opposite sides of an electronic module for clamping and supporting the module between a pair of spaced-apart plates of which at least one plate is a heat sink and which requires compression of a resiliently biased locking member through an aperture preferably in combination with rotation of a shaft member in order to effect release and disengagement between the module and the plates.

BRIEF DESCRIPTION OF THE DRAWINGS

FIG. 6 is a perspective view of a slide block shown in FIGS. 1-3;

FIG. 7 is an end view of the slide block of FIG. 6 taken along view line 7—7;

FIG. 8 is a cross-section of the slide block of FIG. 7 taken along view line 8—8; and FIG. 9 is a side view of another embodiment of a shaft member for use with the locking mechanism of the invention.

SUMMARY OF SOME PREFERRED EMBODIMENTS

Figure 1:
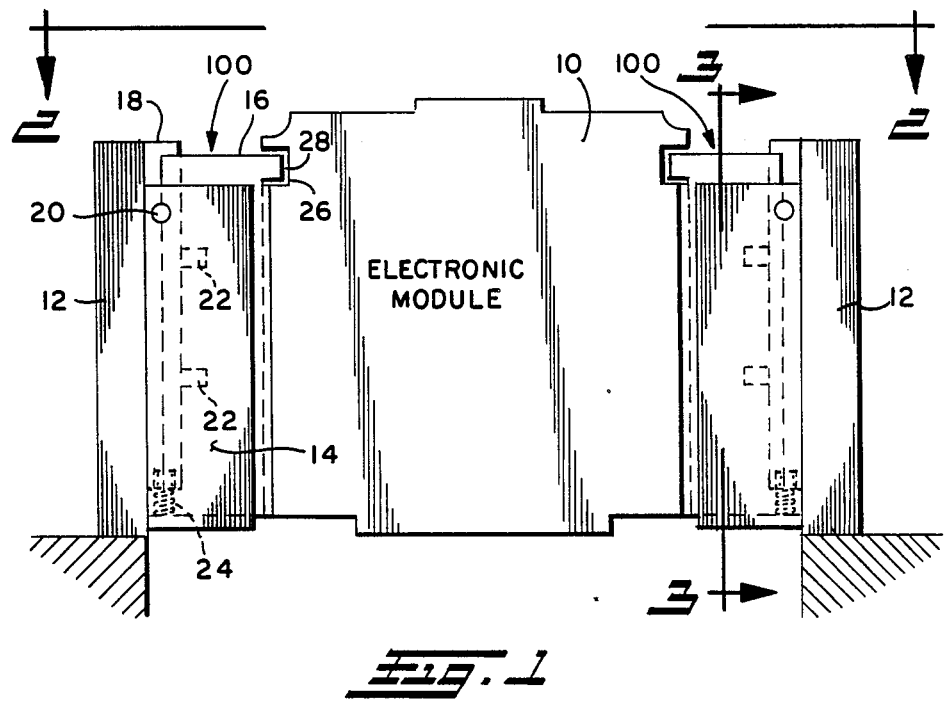
FIG. 1 is a side elevation view of an embodiment of two locking mechanisms of the invention clamping and supporting an electronic module between a pair of plates.

In FIG. 1, a pair of locking mechanisms 100 are being used to clamp and support an electronic module 10 between a pair of spaced-apart plates or walls 12 of which at least one is a chill plate (heat sink) as previously described.

Mechanism 100 has a pair of spaced-apart substantially parallel side walls 14 respectively firmly secured to plate 12 and which extend substantially transversely therefrom and end in spaced-apart relationship to the side of module 10 facing theretowards. At least side walls 14 define a slide track along which a slide block 16 is operable to move towards and away from the module 10 side facing theretowards. The slide track preferably includes a bottom wall 40 (shown in FIG. 3) that extends between side walls 14 to provide a generally u-shaped, channel-like, cross-section.

Slide block 16 includes an elongate slot 15 (referenced in FIG. 6) in the end thereof facing towards plate 12. Slot 15 is adapted to receive a shaft member 18 therein that is provided with resiliently biased locking means for lockingly securing shaft member 18 to at least one side wall 14 and resilient biasing means operative to urge slide block 16 towards and into heat transfer contact engagement with the side of module 10 facing theretowards upon receipt of shaft member 10 into slot 15 as hereinafter described.

As shown in FIG. 1, shaft member 18 is supported in slot 15 by a first resilient biasing means such as coiled spring 24. Spring 24 can rest upon bottom wall 40 of the slide track when such is included or be supported by other suitable means such as a support bar extending between side walls 14 when bottom wall 40 is not included.

Figure 2:
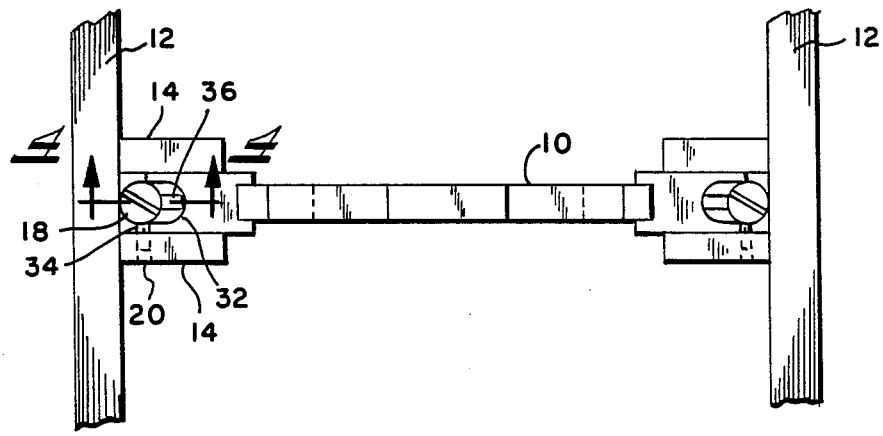
FIG. 2 is a top plan view taken along view line 2—2 of FIG. 1.

As shown in FIGS. 1 and 2 and hereinafter described in greater detail with respect to FIGS. 4 and 5, shaft member 18 is provided with second resilient biasing means preferably comprising at least one detent pin and more preferably two spaced-apart detent pins 36 that are disposed in axial aligned openings 22 in the side of shaft member 18 and are resiliently biased towards and into engagement with surface 32 of slide block 16 within slot 15 facing towards plate 12.

Shaft member 18 also includes resiliently biased locking means preferably in the form of detent pin 34 that is supported in an opening 21 (shown in FIG. 5) that is in substantial transverse relationship with opening(s) 22 and is resiliently biased into opening 20 through at least one of side walls 14 proximate plate 12 when brought into registration therewith.

As shown in FIG. 1, the side of module 10 commonly includes a groove or slot 26 therein facing towards slide block 16 that is substantial traverse relationship to side walls 14. Slide block 16 preferably includes a protuberance such as tongue 28 extending from the end thereof facing towards groove 26 that is in registration therewith and extends thereinto to support module 10 when slide block 16 is moved into heat transfer contact engagement with module 10.

Figure 3:
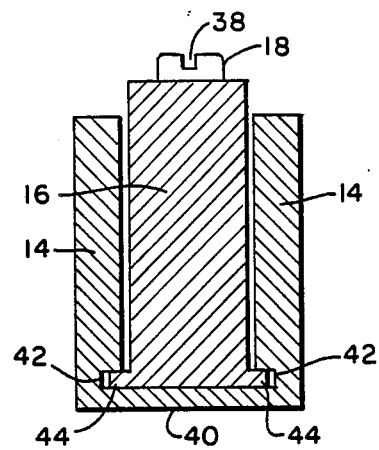
FIG. 3 is a cross-section of the locking mechanism of the invention taken along line 3—3 of FIG. 1.

As shown in FIG. 3, slide block 16 preferably has an inverted "T" shaped cross-section provided by a pair of tongues 44 respectively extending from opposite sides thereof that are received into opposed facing grooves 42 extending along walls 14 adjacent bottom wall 40. Grooves 42 and tongues 44 are adapted to enable slide block 16 to slide in opposite directions along grooves 42. It is to be noted that in the event bottom 40 is omitted, grooves 42 and tongues 44 in themselves operate to enable side walls 14 to provide a slide track for slide block 16.

Also shown in FIG. 3, is a slot 38 in the top of shaft member 18. Slot 38 is adapted to receive the end of a screwdriver therein for rotation of shaft member 18 for both urging slide block 16 towards the side of module 10 and for lockingly securing shaft 16 to side wall 14 and locking slide block 16 in heat transfer engagement with module 10 which is the preferred embodiment as hereinafter described. Other means may be used for rotating shaft member 18 such as by providing a handle or flats for a wrench or the like in place of slot 38.

Figure 4:
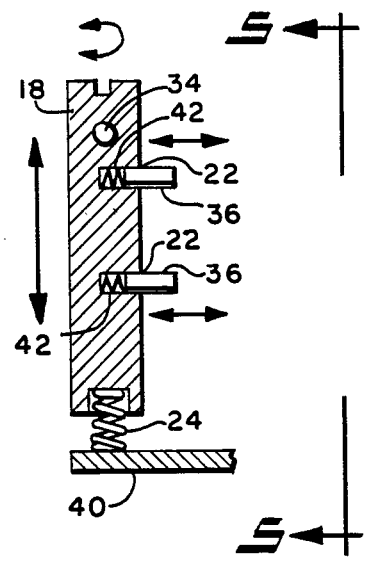
FIG. 4 is a cross-section through the shaft member of FIG. 1 taken along line 4—4 of FIG. 2.
Figure 5:
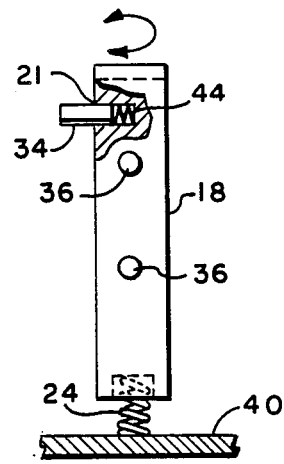
FIG. 5 is a partially sectioned side view of the shaft member of FIG. 4 taken along view line 5—5.

As shown in FIGS. 4 and 5, shaft member 18 is preferably provided with a pair of detent pins 36 in spaced-apart openings 22 that are resiliently biasable transversely towards and away from shaft member 18 by resiliently biasing means such as coiled springs 42 contained in openings 22. Likewise, detent pin 34 is disposed in opening 21 in substantial transverse relationship to detent pins 36. Detent pin 34 is resiliently biased transversely towards and away from shaft member 18 as shown by the arrows by resilient biasing means such as coiled spring 44 contained in opening 21. As previously described, shaft member 18 is supported in slot 15 by first resilient biasing means such as coiled spring 24.

As shown in FIG. 6, slot 15 preferably is an arcuate cross-section having a surface 32 therewithin facing towards shaft member 18 when shaft member 18 is inserted thereinto adjacent plate 12.

Surface 32 preferably includes a pair of substantially parallel spaced-apart grooves 48 therein that are preferably in substantial transverse relationship to side walls 14. Grooves 48 are registerable with respective detent pins 36 when shaft member 18 is inserted into slot 15 and spring 24 is compressed the prescribed amount by pressing downwardly on shaft member 18.

In operation, shaft member 18 is preferably inserted into slot 15 with detent pins 36 facing toward one of side walls 14 and detent pin 34 facing towards surface 32. When spring 24 is compressed to prescribed amount, rotation of shaft member 18 a quarter-turn causes detent pins 36 to move along grooves 48 and urge slide block 16 along the slide track and engage with the side of module 10 whilst detent 34 is brought into registration with opening 20 through wall 14 and is resiliently biased thereinto by spring 44 to lockingly secure shaft member 18 to wall 14 as well as lock slide block 10 in heat transfer contact engagement with module 10.

It is to be understood that surface 32 may also be an arcuate surface not requiring grooves 48 and shaped to provide greater clearance between shaft member 18 and side walls 14 than between shaft member 18 and surface 32 such that after insertion of shaft member 18 into slot 15 with detent pins 36 facing towards one of side walls 14, a quarter-turn of shaft member 18 causes detent pins 36 to move along surface 32 and urge slide block 16 into engagement with the side of module 10.

Likewise, spiral groove(s) may be provided in surface 32 that are adapted to enable detent pin(s) 36 to spiral therealong and urge slide block 16 into engagement with module 10 while shaft member 18 is being rotated and pressed downwardly.

As shown in FIG. 6, slide block 16 preferable includes a recess 46 in the end thereof facing towards the side of module 10. Recess 46 is adapted to receive the side of module 10 thereinto and thereby extend about the sides of module 10 to provide a greater heat transfer contacting surface area between slide block 16 and module 10.

Since shaft member 18 is positioned within slot 15 adjacent plate 12, plate 12 provides a stop for resisting the reaction force exerted on shaft member 18 therestowards by springs 42 as detent pins 36 engage and urge slide block 16 towards the side of module 10.

The resiliently biased extension of detent pin 34 into opening 20 positively locks slide block 16 in heat transfer contact engagement with module 10. In order to disengage the two, one must reach into opening 20 by hand or with a suitable tool and press detent pin 34 towards shaft member 18 from outside side wall 14 and compress spring 44 sufficiently to enable pin 34 to clear the inside of wall 14 and thereby enable shaft member 18 to be rotated and removed from slot 15. Such is of great advantage making it difficult for vibration and handling to inadvertantly release slide block 16 from engagement with module 10.

FIG. 9 shows an embodiment of shaft member 18 that does not require rotation by replacing detent pins 36 with a resilient leaf spring 50 adapted to engage surface 32 and urge slide block 16 into engagement with module 10 as shaft member 18 is pressed downwardly in slot 15 without rotation. Although not shown in the FIGURES, leaf spring 50 may be secured to surface 32 rather than shaft member 18 and adapted to engage shaft member 18 as it is pressed downwardly into slot 15.

Slide block 16 is made from a heat conductive material such as aluminum or a suitable aluminum alloy as are at least one of the slide track and shaft member 18 enabling heat to be conducted therethrough and into plate (heat sink) 12.

What is claimed is:

1. A locking mechanism for securing an electronic module between a pair of spaced-apart plates with at least one of the plates comprising a chill plate against which one of opposite sides of the module is held in heat transfer contacting relationship therewith, said mechanism comprising;

a slide track having at least a pair of substantially parallel spaced-apart side walls secured to the chill plate and extending therefrom towards and ending in spaced-apart relationship to the module side facing theretowards, a heat conductive slide block disposed between the slide track side walls, means for supporting and for enabling the slide block to move along the slide track towards and away from the module side facing theretowards, an elongate open-sided slot disposed along an end of the slide block adjacent the chill plate and in substantial parallel alignment with the slide track side walls, a shaft member disposed in the slide block slot adjacent the chill plate, first resilient biasing means supporting the shaft member in the slot, second resilient biasing means disposed between the shaft member and a surface of the slide block within the slot facing towards the chill plate, an aperture extending through at least one of the slide track side walls in proximity to the chill plate, resiliently biased releasable locking means supported on at least one side of opposed sides of the shaft member in substantial transverse relationship to the second biasing means, said locking means registerable with the slide track side wall aperture and operable to extend thereinto and lockingly secure the shaft member to the slide track when the first biasing means is compressed a prescribed amount, and said locking mechanism operable such that receipt of the shaft member into the slide block slot adjacent the chill plate causes the second biasing means to urge the slide block along the slide track towards the module side for a distance sufficient to establish the heat transfer contacting relationship therebetween and compression of the first biasing means the prescribed amount by pressing upon the shaft member causes the locking means to enter the side wall aperture and lockingly secure the shaft member to the slide track and hold the slide block in secured heat transfer contacting engagement with the module side and compression of the locking means through the aperture towards the shaft member a prescribed amount causes the locking means to release from the side wall enabling removal of the shaft member from the slide block slot and movement of the slide block along the slide track in a direction away from the module side.

2. The locking mechanism of claim 1 wherein the means for supporting and enabling the slide block to move along the slide track is provided by the slide track including a bottom wall extending substantially transversely between the side walls thereof, the side walls include respective grooves extending therealong in facing relationship adjacent the intersection between the bottom and the side walls, the slide block includes respective tongues extending from opposite sides thereof into the grooves adapted to enable the slide block to move relative the slide track therealong, and the bottom provides a surface upon which the first biased means is disposed for supporting the shaft member in the slide block slot.

3. The locking mechanism of claim 1 wherein the second biasing means comprises a resilient leaf spring extending from at least one of the slide block surface within the slot facing towards the chill plate and a side of the shaft member facing theretowards and adapted to bias the slide block against the module side when the shaft member is received into the slide block slot.

4. The locking mechanism of claim 1 wherein the second biasing means comprises at least one detent pin disposed in an opening in the side of the shaft member facing towards the slide block surface within the slot and a resilient biasing member is included within the opening operative to urge the detent pin theretowards for engagement therewith when the shaft member is received into the slot.

5. The locking mechanism of claim 4 having two of said detent pins disposed in substantially axially aligned spaced-apart relationship to each other in respective openings in the side of the shaft member facing towards the slide block surface within the slot and including respective resilient biasing members within the openings operative to urge the detent pins against the slide block surface when the shaft member is received into the slot.

6. The locking mechanism of claims 1, 2, 3, 4 or 5 wherein the locking means comprises a detent pin disposed in an opening in the side of the shaft member facing towards the slide track side wall within the slot having the aperture therethrough and a resilient biasing member is disposed with the opening and operative to urge the pin into the aperture for locking engagement therewith when the first biasing means is compressed by the shaft member the prescribed amount.

7. The locking mechanism of claim 1, 2, 3, 4 or 5 wherein the module side facing towards the slide block includes an open sided groove facing theretowards in substantial transverse relationship to the slide track side walls and the end of the slide block facing towards the module side includes a protuberance extending therefrom towards the groove and that is registerable therewith and operable to extend thereinto and provide support for the module when the slide block is biased against the module side by the second biasing means.

8. The locking mechanism of claim 6 wherein the module side facing towards the slide block includes a open sided groove facing theretowards in substantial transverse relationship to the slide track side walls and the end of the slide block facing towards the module side includes a protuberance extending therefrom towards the groove and that is registerable therewith and operable to extend thereinto and provide support for the module when the slide block is biased against the module seen by the second biasing means.

9. The locking mechanism of claim 1 wherein the shaft member is a rotatable shaft member, second biasing means comprises at least one detent pin disposed in an opening in the side of the shaft member having a resilient member within disposed the opening biasing the detent pin therefrom, the locking means comprises a detent pin disposed in an opening in the side of the shaft member in substantial transverse relationship to the second biasing means pin and having a resilient member disposed within the opening biasing the detent pin therefrom, and the slide block surface within the slot facing towards the chill plate includes a groove facing towards the chill plate operative to receive the second biasing means detent pin therein and urge the slide block towards the module side when the shaft member is received into the slot and rotated in registration therewith whilst simultaneously rotating the locking means into facing relationship with the side wall aperture for locking engagement therewith upon compression of the first biasing means the prescribed amount by the first shaft member.

10. The locking mechanism of claim 9 having two of said second biasing means disposed in substantially axially aligned spaced-apart openings in the side of the shaft member and the slide block surface within the slot facing towards the chill plate includes a pair of spaced-apart grooves respectively registerable therewith when the shaft member is received and rotated within the slot.

* * * * *